US011995320B2

(12) United States Patent
Rayaprolu et al.

(10) Patent No.: US 11,995,320 B2
(45) Date of Patent: May 28, 2024

(54) SCAN FRAGMENTATION IN MEMORY DEVICES

(71) Applicant: Micron Technology, Inc., Boise, ID (US)

(72) Inventors: Vamsi Pavan Rayaprolu, Santa Clara, CA (US); Christopher M. Smitchger, Boise, ID (US); Saeed Sharifi Tehrani, San Diego, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/824,562

(22) Filed: May 25, 2022

(65) Prior Publication Data

US 2022/0391102 A1 Dec. 8, 2022

Related U.S. Application Data

(60) Provisional application No. 63/208,404, filed on Jun. 8, 2021.

(51) Int. Cl.
*G06F 3/06* (2006.01)

(52) U.S. Cl.
CPC .......... *G06F 3/0616* (2013.01); *G06F 3/0653* (2013.01); *G06F 3/0679* (2013.01)

(58) Field of Classification Search
CPC ..... G06F 3/0616; G06F 3/0653; G06F 3/0679
See application file for complete search history.

(56) References Cited

U.S. PATENT DOCUMENTS

| | | | |
|---|---|---|---|
| 2013/0028021 A1* | 1/2013 | Sharon | G11C 16/3459 365/185.17 |
| 2013/0145082 A1* | 6/2013 | Tamagawa | G06F 12/0246 711/103 |
| 2013/0346805 A1* | 12/2013 | Sprouse | G11C 16/3431 714/E11.178 |
| 2015/0085575 A1* | 3/2015 | Tam | G11C 29/50004 365/185.11 |
| 2016/0335144 A1* | 11/2016 | Cai | G06F 11/0754 |
| 2019/0096492 A1* | 3/2019 | Cai | G11C 29/44 |
| 2021/0319834 A1* | 10/2021 | Sharifi Tehrani | G11C 7/1045 |
| 2022/0180922 A1* | 6/2022 | Rayaprolu | G11C 11/40622 |
| 2022/0199184 A1* | 6/2022 | Muchherla | G11C 29/52 |
| 2022/0392516 A1* | 12/2022 | Cha | G11C 29/4401 |
| 2023/0130533 A1* | 4/2023 | Chae | G11C 29/10 714/719 |

* cited by examiner

*Primary Examiner* — Ryan Bertram
(74) *Attorney, Agent, or Firm* — Lowenstein Sandler LLP

(57) ABSTRACT

A memory system includes a memory device and a processing device, operatively coupled to the memory device. The processing device performs operations comprising: identifying one or more mandatory scan wordlines of the memory device and one or more remaining wordlines of the memory device; performing a plurality of scan iterations with respect to a plurality of pages of the memory device, such that performing each scan iteration comprises: identifying, among the remaining wordlines, one or more scheduled scan wordlines of the memory device, scanning a subset of pages of the memory device that are addressable by the mandatory scan wordlines and the scheduled scan wordlines; wherein a combination of a first plurality of pages addressable by the scheduled scan wordlines selected by the plurality of scan iterations and a second plurality of pages addressable by the mandatory wordlines comprises the plurality of pages of the memory device.

17 Claims, 5 Drawing Sheets

SCAN FRAGMENTATION IN MEMORY DEVICES

REFERENCE TO RELATED APPLICATIONS

This application claims the benefit of U.S. Provisional Application No. 63/208,404, filed Jun. 8, 2021, the entirety of which is incorporated herein by reference.

TECHNICAL FIELD

Embodiments of the disclosure are generally related to memory sub-systems, and more specifically, related to scan fragmentation strategies based on memory degradation and system requirements.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of some embodiments of the disclosure.

DETAILED DESCRIPTION

Figure 1:
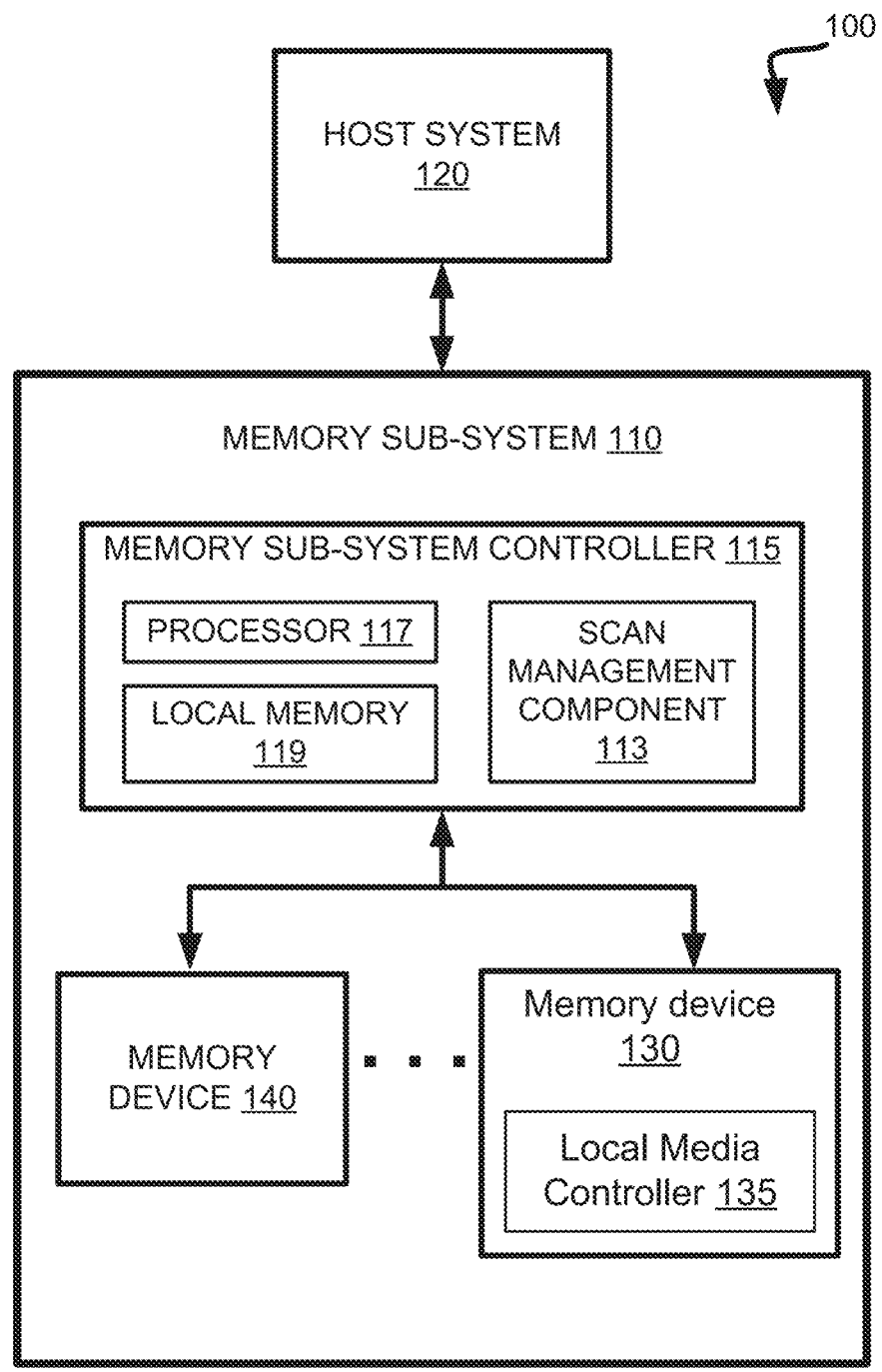
FIG. 1 illustrates an example computing system that includes a memory sub-system, in accordance with some embodiments of the disclosure.

Embodiments of the disclosure are directed to scan fragmentation strategies based on memory degradation and system requirements. One or more memory devices can be a part of a memory sub-system, which can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

The memory sub-system can perform various data operations, e.g., host-initiated data operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, hereinafter is referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., error correction code (ECC) codeword, parity code), data version (e.g., used to distinguish age of data written), valid bitmap (indicating which LBAs or logical transfer units contain valid data), and the like.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1.

A non-volatile memory device is a package of one or more dies. Each die can include two or more planes. For some types of non-volatile memory devices (e.g., NAND devices), each plane includes of a set of physical blocks. In some implementations, each block can include multiple sub-blocks. Each plane carries a matrix of memory cells formed onto a silicon wafer and joined by conductors referred to as wordlines and bitlines, such that a wordline joins multiple memory cells forming a row of the matric of memory cells, while a bitline joins multiple memory cells forming a column of the matric of memory cells.

Depending on the cell type, each memory cell can store one or more bits of binary information, and has various logic states that correlate to the number of bits being stored. The logic states can be represented by binary values, such as "0" and "1", or combinations of such values. A set of memory cells referred to as a memory page can be programmed together in a single operation, e.g., by selecting consecutive bitlines.

A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information. Thus, the read operation can be performed by comparing the measured voltage exhibited by the memory cell to one or more reference voltage levels in order to distinguish between two logical levels for single-level cells and between multiple logical levels for multi-level cells.

Due to various physical phenomena and operational processes, such as slow charge loss and read disturb, charge levels of memory cells may degrade in time, thus causing higher error rates in memory read operations. The resulting memory degradation can be measured by various data state metrics. "Data state metric" herein shall refer to a quantity that is measured or inferred from the state of data stored on a memory device. Specifically, the data state metrics may reflect the state of the slow charge loss, the degree of read disturb, and/or other measurable functions of the data state. A composite data state metric is a function (e.g., a weighted sum) of a set of component state metrics. In an illustrative example, the data state metric can be represented the raw bit error rate (RBER), which is the number of bit errors experienced by a given data block per unit of time.

In order to mitigate the memory degradation, data integrity check operations (also referred to herein as "scan operations") can be periodically performed on the memory device. The data integrity check can involve evaluation of one or more data state metrics on one or more blocks of the memory device. Should the data integrity check indicate that one or more data state metrics fail to satisfy respective quality criteria (e.g., the RBER exceeds a predefined threshold), one or more media management operations can be performed on the affected blocks in order to mitigate the detected memory degradation. In an illustrative example, the media management operations can include refresh, or "folding," operations, which involve relocating the data stored at an affected block of the memory device to another block.

Some memory sub-systems can perform periodic exhaustive background scan operations, i.e., sequentially scan all pages (addressable by respective wordlines) of all blocks of all memory devices. For certain types of applications, exhaustive scan may need to be completed within a predetermined period of time (e.g., 30 days). However, as the number of wordlines per block in memory devices increases, the scan frequency should also be increased in order to satisfy pertinent time period requirements for exhaustive scan. As scan operations consume certain resources of the memory sub-system, increasing the scan frequency can result in a noticeable degradation of the memory sub-system performance. Conversely, limiting the scan frequency in order to meet the performance requirements can result in in failure to meet the scan period requirements. Furthermore, longer exhaustive scan periods can lead to unacceptable levels of memory degradation in some pages, since pages addressable by some wordlines can be more susceptible to various memory degradation mechanisms and therefore may need to be scanned more often than pages addressable by other wordlines.

Aspects of the present disclosure address the above and other deficiencies by introducing scan fragmentation method based on memory degradation parameters and system requirements. In an illustrative example, a subset of "weak" wordlines of the memory device is identified, such that the pages addressable by the identified "weak" wordlines are more susceptible to various memory degradation mechanisms. In all blocks of the memory device, the pages addressable by the identified "weak" wordlines, which are also referred to herein as "mandatory" wordlines, would be scanned by every scan iteration. Additionally, every scan iteration would include, for each block of the memory device, the pages that are addressable by a subset of the remaining wordlines, which are referred to herein as "scheduled" wordlines. Accordingly, the full scan would include a certain number of scan iterations, such that each iteration scans, for all blocks of the memory device, the pages addressable by all mandatory wordlines and the pages addressable by one or more scheduled wordlines.

Therefore, advantages of the systems and methods implemented in accordance with aspects of the present disclosure include ensuring consistent memory degradation characteristics throughout a given memory device by implementing scheduled scan and media management operations which may be performed on the pages addressable by the "weak" wordlines more frequently than on pages addressable by the remaining wordlines, while guaranteeing that the full scan of all blocks of the memory device be performed within the time period specified by the system requirements.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks. Some types of memory, such as 3D cross-point, can group pages across dice and channels to form management units.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as media management operations (including wear leveling operations and garbage collection operations), error detection and error-correcting code (ECC) operations, encryption operations, caching operations, and address translations between a logical address (e.g., a logical address, namespace) and a physical address (e.g., physical MU address, physical block address) that are associated with the memory devices 130.

Each physical management unit (e.g., block) can be programmed and erased reliably up to a certain number of times. For write-intensive applications, the memory sub-system controller 115 can implement a wear leveling algorithm to monitor and spread the number of write cycles per block. The wear leveling algorithm ensures that equal use is made of all the available write cycles for each block.

The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115)

can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 includes a scan management component 113 that can be used to implement charge loss scan operation management, in accordance with embodiments of the disclosure. In some embodiments, the controller 115 includes at least a portion of the scan management component 113. For example, the controller 115 can include a processor 117 (processing device) configured to execute instructions stored in local memory 119 for performing the operations described herein. In some embodiments, the scan management component 113 is part of the host system 120, an application, or an operating system. The scan management component 113 can manage block scanning operations, as described in more detail herein below.

In one embodiment, the scan management component 113 can implement a scan fragmentation method based on memory degradation parameters and system requirements. In the present description, "scan fragment" refers to a set of wordlines addressing the pages that should be scanned within a block before moving to the next block of the memory device. "Full scan instance" defines the loop in which all blocks are scanned for all scan fragments.

In an illustrative example, the scan management component 113 can identify a subset of "weak" wordlines of a memory device 130, such that the pages addressable by the identified "weak" wordlines are more susceptible to various memory degradation mechanisms. In one embodiment, some wordlines of the memory device can be pre-characterized as "weak," and the identifiers of those wordlines can be stored in the firmware metadata structure residing in one or more reserved metadata blocks of the memory device 130. In another embodiment, the "weak" wordlines can be dynamically identified during the lifecycle of the memory device 130, e.g., by selecting, among all wordlines of the memory device 130, a subset of wordlines addressing the pages that generate the largest number of error handling operations.

In some embodiments, different sets of "weak" wordlines can be identified based on the bit-per-cell characteristic of the blocks, e.g., for single level cell (SLC) blocks, multiple level cell (MLC) blocks, triple level cell (TLC) blocks, quad level cell (QLC) blocks, etc.

The full scan of the memory device 130 can include multiple scan iterations, such at every scan iteration involves scanning, in all blocks of the memory device, the pages addressable by the identified "weak" wordlines, which are referred to herein as "mandatory" wordlines. Every scan iteration further involves scanning, for each block of the memory device, the pages that are addressable by a subset of the remaining wordlines, which are referred to herein as "scheduled" wordlines. Accordingly, the full scan would include scanning all pages of all blocks of the memory device by performing a certain number of scan iterations, such that each iteration scans, for all blocks of the memory device, the pages addressable by all mandatory wordlines and the pages addressable by one or more scheduled wordlines.

Therefore, the full scan would ensure consistent memory degradation characteristics throughout the memory device 130 by implementing scheduled scan and media management operations which would be performed on the pages addressable by the "weak" wordlines more frequently than on pages addressable by the remaining wordlines, while guaranteeing that the full scan of all blocks of the memory device be performed within the time period specified by the system requirements.

Figure 2:
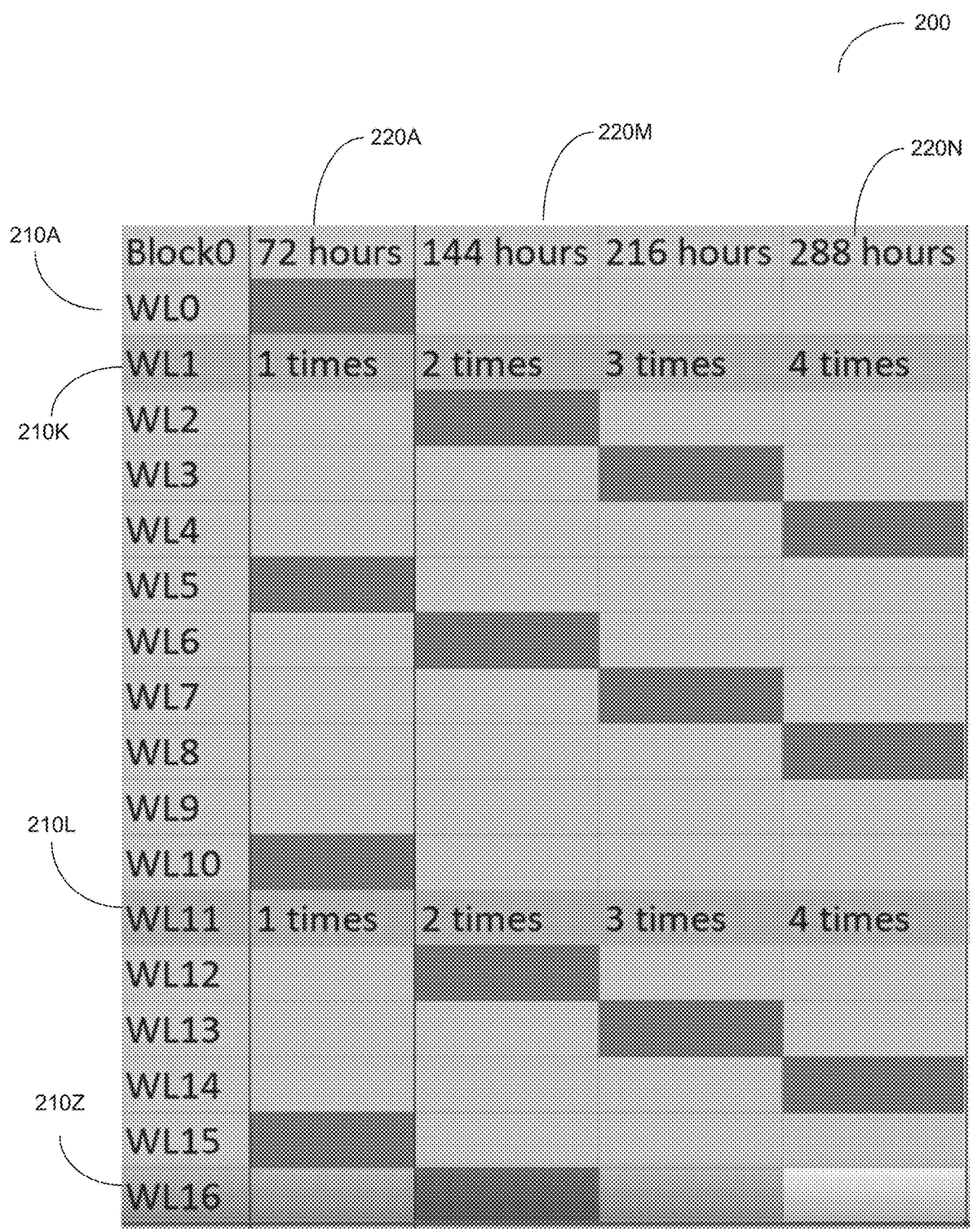
FIG. 2 schematically illustrates an example full scan implemented by the memory sub-system controller operating in accordance with aspects of the present disclosure.

FIG. 2 schematically illustrates an example full scan implemented by the memory sub-system controller operating in accordance with aspects of the present disclosure. As schematically illustrated by FIG. 2, the full scan 200 can include, for every block of the memory device 130 of FIG. 1, performing periodic scan iterations 220A-220N. Each scan iteration 220 includes scanning the pages addressable by all mandatory wordlines 210K and 210L. Accordingly, after performing m-th scan iteration 220M, the pages addressable by all mandatory wordlines 210K and 210L would be scanned M times.

Each scan iteration 220 further includes scanning a subset of remaining wordlines, which are referred to as "scheduled" wordlines (e.g., WL0, WL5, WL10 and WL15 during the first scan iteration, WL1, WL6, WL11 and WL11 during the second scan iteration, etc). Accordingly, after performing all scan iterations 220A-220N, pages addressable by all wordlines would be scanned at least once.

In some embodiments, a scan operation performed by the memory sub-system controller on a given page can involve reading the page and computing the values of one or more data state metrics (e.g., the bit error rate). In an illustrative example, the bit error rate involve evaluating the bits that have been read from the given page by an error checking mechanism implemented by the memory device. The error checking mechanism can validate and, if necessary, correct a sequence of data bits that have been read from the memory device by one or more redundancy metadata bits stored on the memory device in association with the sequence of data bits (e.g., a checksum of a hash of the sequence of data bits).

Thus, responsive to determining that the value of the data state metric fails to satisfy a predefined quality criterion (e.g., the bit error rate exceeds a predefined threshold), the memory sub-system controller can perform a media management operation (e.g., a folding operation) with respect to the block comprising the given page.

Certain situations may require modifying the above-described scan scheduling strategies. In particular, upon a power-up event, the memory subsystem controller may need to scan erased pages in all open cursor blocks prior to any data being written to the block. "Cursor" herein refers to a processing thread that writes multiple blocks of data to a chosen location of the memory device.

Accordingly, the memory sub-system controller would scan two erased pages in every open cursor block: one page on the last programmed wordline incremented by one, and one page in the last wordline group. Should these pages fail a predefined quality criterion, no additional data should be programmed into that block and a new block be opened for that cursor. Once the power on requirements are met, the full scan can continue per its normal schedule Accordingly, every time a new scan fragment is selected, the open cursor blocks are scanned first as per block selection order criteria. In order to ensure that a sufficient margin exists within these blocks over the time in which they remain open, the blocks can be re-scanned at faster rate than the frequency at which a new scan instance would be started. In an illustrative example, open cursor and erase pool blocks should be scanned at a frequency equal to MS_OPEN_CURSOR_FREQ. Accordingly, upon determining that MS_O-

PEN_CURSOR_FREQ has elapsed since the block has been opened/erased, the memory subsystem controller can add the open cursor/erased blocks back into the pool of blocks to be scanned with high priority using the currently selected scan fragment (i.e., as soon as scan operations with respect to the current block are completed, the memory sub-system controller would scan the current scan fragment wordlines within each of open cursor/erased blocks). In some embodiments, for erased blocks, only the mandatory wordlines can be scanned.

Figure 3:
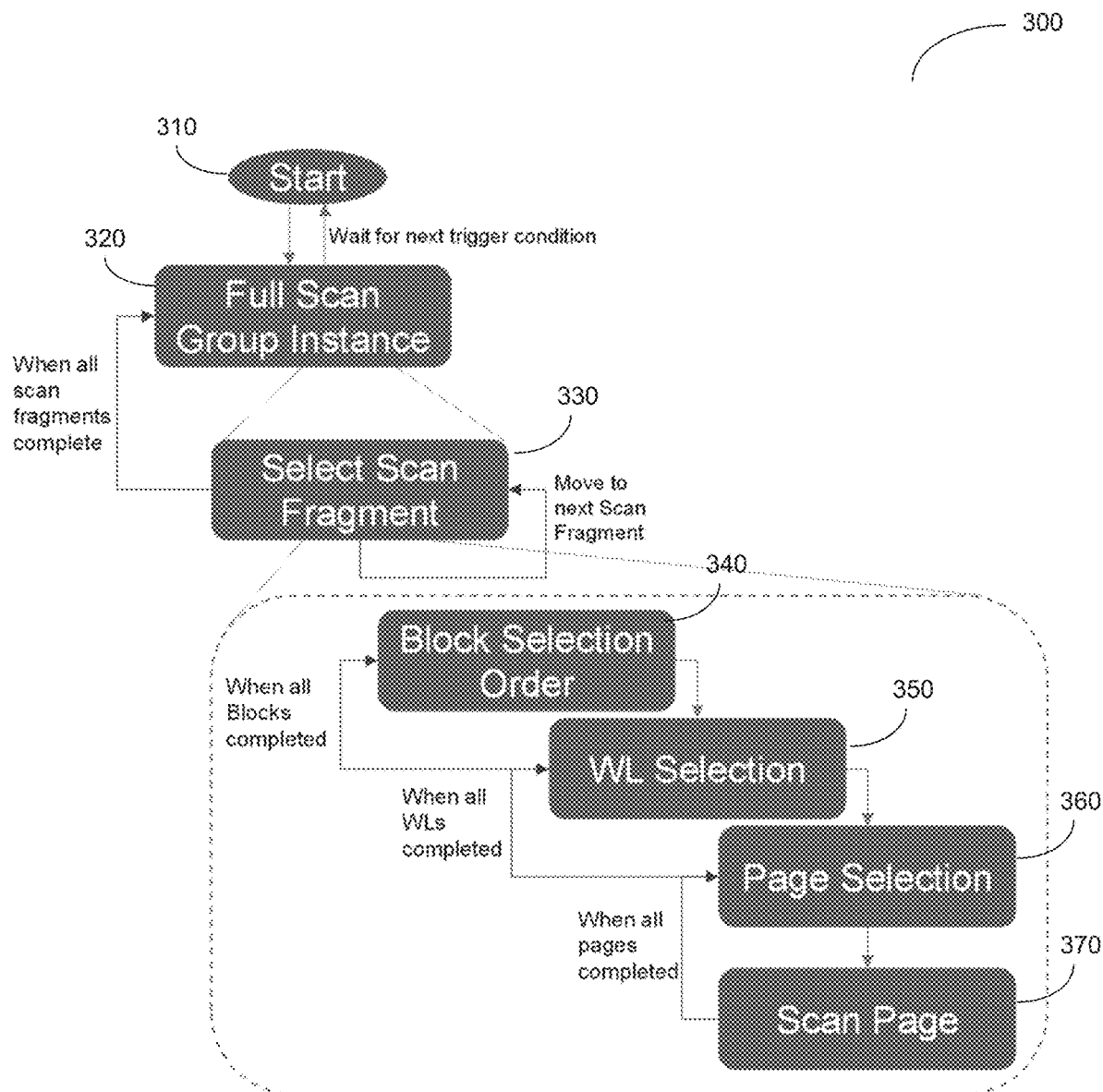
FIG. 3 is a flow diagram of an example method of performing a full scan of a memory device, in accordance with some embodiments of the disclosure.

FIG. 3 is a flow diagram of an example method of performing a full scan of a memory device, in accordance with some embodiments of the disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the scan management component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 310, the processing logic can evaluate one or more full scan instance triggering conditions and initiate the full scan instance at operation 320 responsive to determining that at least one full scan instance triggering condition has been satisfied. In an illustrative example, a full scan instance can be triggered responsive to detecting a new clean power cycle (e.g., a power up event following a graceful shutdown event). In another illustrative example, a full scan instance can be triggered responsive to detecting a "dirty" power cycle (e.g., a power up event following an asynchronous power loss event). In another illustrative example, a full scan instance can be triggered responsive to detecting any power state in which the system timer has been lost or reset. In another illustrative example, a full scan instance can be triggered responsive to determining that a predefined period of time has elapsed since the start or completion of the previous full scan instance.

At operation 330, the processing logic can select the scan fragment for performing scanning operations. The scan fragment can include one or more mandatory wordlines and one or more scheduled wordlines, as explained in more detail herein above. In an illustrative example, the first iteration of the full scan instance can involve selecting a random scan fragment, and the scan fragment identifier can be incremented at each subsequent scan iteration, while wrapping around to the first fragment after reaching the fragment having the largest identifier among all fragments. In various illustrative examples, other techniques can be utilized for selecting the scan fragment (e.g., applying a predefined functional transformation to the identifier of the scan fragment selected for the previous iteration of the full scan instance).

At operation 340, the processing logic selects a set of blocks for scanning. In an illustrative example, blocks from one or more open cursors can be selected. In another illustrative example, one or more data blocks having a predefined number of bits-per-cell (e.g., QLC or SLC blocks) can be randomly selected.

At operation 350, the processing logic selects a set of wordlines for scanning. In some embodiments, the set of wordlines can include all mandatory wordlines and one or more scheduled wordlines, as explained in more detail herein above. In an illustrative example, the scheduled wordlines can be selected based on a predefined look-up table. In another illustrative example, the wordline having the minimum wordline number can be scheduled for the first scan fragment, and the wordline number can be incremented for each subsequent scan fragment. In another illustrative example, a predefined functional transformation can be applied to the identifier of a wordline selected for the previous scan fragment. Responsive to scanning all wordlines in the selected scan fragment, the method loops back to operation 340 for block selection.

At operation 360, the processing logic selects a page for scanning. In an illustrative example, the page selection can be performed based on the start page identifier and end page identifier, which can be chosen for a given wordline using a predefined look-up table. The processing logic can randomly select a page number between 1 and (end page identifier–start page identifier+1)/bits-per-cell. The lower page identifier can therefore be determined as the start page identifier incremented by a product of a random integer and the number of bits per cell. The upper page identifier can be equal to the lower page identifier incremented by one. The extra page identifier can be equal to the lower page identifier incremented by two. The top page identifier can be equal to the lower page identifier incremented by three. Responsive to scanning the selected set of pages, the method loops back to operation 350 for wordline selection.

At operation 370, the processing logic scans the selected page, as described in more detail herein above. In certain implementations, different scan operations can be performed for erased pages, partially written pages, and fully written pages. In an illustrative example, for erased pages, the NDEP scan can be performed, which determines whether the voltage distribution for the erased page has moved beyond a certain point. For fully written pages, the valley health scan can be performed, which identifies and evaluates the state of the margins between threshold voltage distribution valleys. Responsive to scanning the selected page, the method loops back to operation 360 for selecting the next page for scanning. Responsive to determining that all scan fragments have been scanned, the full scan instance terminates.

Figure 4:
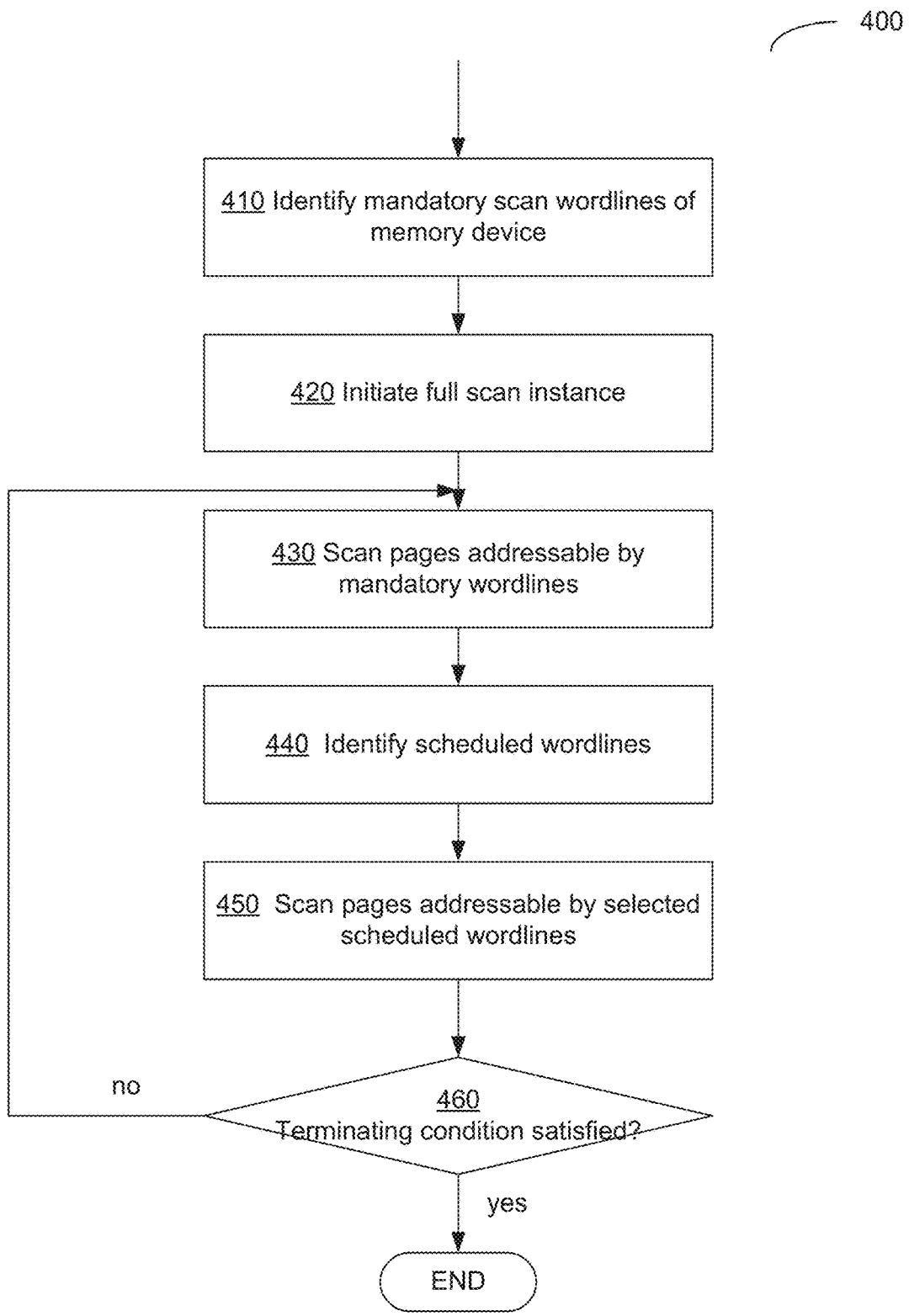
FIG. 4 is a flow diagram of another example method of performing a full scan of a memory device, in accordance with some embodiments of the disclosure.

FIG. 4 is a flow diagram of another example method of performing a full scan of a memory device, in accordance with some embodiments of the disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the scan management component 114 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 410, the processing logic identifies one or more mandatory scan wordlines of the memory device and one or more remaining wordlines (also referred to as "scheduled" wordlines herein) of the memory device. In an illustrative example, the processing logic identifies a subset of "weak" wordlines of a memory device as mandatory wordlines to be scanned at every iteration of the full scan instance. In one embodiment, some wordlines of the memory device can be pre-characterized as "weak," and the identifiers of those wordlines can be stored in the firmware metadata structure residing in one or more reserved metadata blocks of the memory device. In another embodiment, the "weak" wordlines can be dynamically identified during the lifecycle of the memory device, e.g., by selecting, among all wordlines of the memory device, a subset of wordlines addressing the pages that generate the largest number of error handling operations, as described in more detail herein above.

At operation 420, the processing logic initiates a full scan instance of the memory device. The full scan instance involves performing multiple scan iterations with respect to the memory device.

At operation 430, the processing logic scans the pages addressable by the mandatory wordlines. Scanning a page may involve evaluating, with respect to that page, a data state metric (e.g., a bit error rate). Responsive to determining that the value of the data state metric fails to satisfy a predefined quality criterion (e.g., the bit error rate exceeds a predefined threshold), the processing logic can performing a media management operation (e.g., a folding operation) with respect to the block that includes that page, as explained in more detail herein above.

At operation 440, the processing logic selects one or more wordlines among the plurality of scheduled wordlines. In an illustrative example, the processing logic randomly selects one or more wordlines for the first iteration of the full scan instance, and at every subsequent iteration increments each of the wordline identifiers by a predefined increment value. In another illustrative example, the processing logic randomly selects one or more wordlines for the first iteration of the full scan instance, and at every subsequent iteration applies a predefined functional transformation to each of the wordline identifiers by a predefined increment value, as described in more detail herein above.

At operation 450, the processing logic scans the pages addressable by the selected scheduled wordlines. Scanning a page may involve evaluating, with respect to that page, a data state metric (e.g., a bit error rate). Responsive to determining that the value of the data state metric fails to satisfy a predefined quality criterion (e.g., the bit error rate exceeds a predefined threshold), the processing logic can performing a media management operation (e.g., a folding operation) with respect to the block that includes that page, as explained in more detail herein above.

Responsive to determining, at operation 460 that a terminating condition has been satisfied, the method terminates; otherwise the method loops back to operation 430. In an illustrative example, the terminating condition ascertains whether all pages of all blocks of the memory device have been scanned by the current full scan instance. In another illustrative example, the terminating condition ascertains whether the combination of the scheduled scan wordlines selected by the plurality of scan iterations and the mandatory wordlines includes all wordlines of the memory device.

Figure 5:
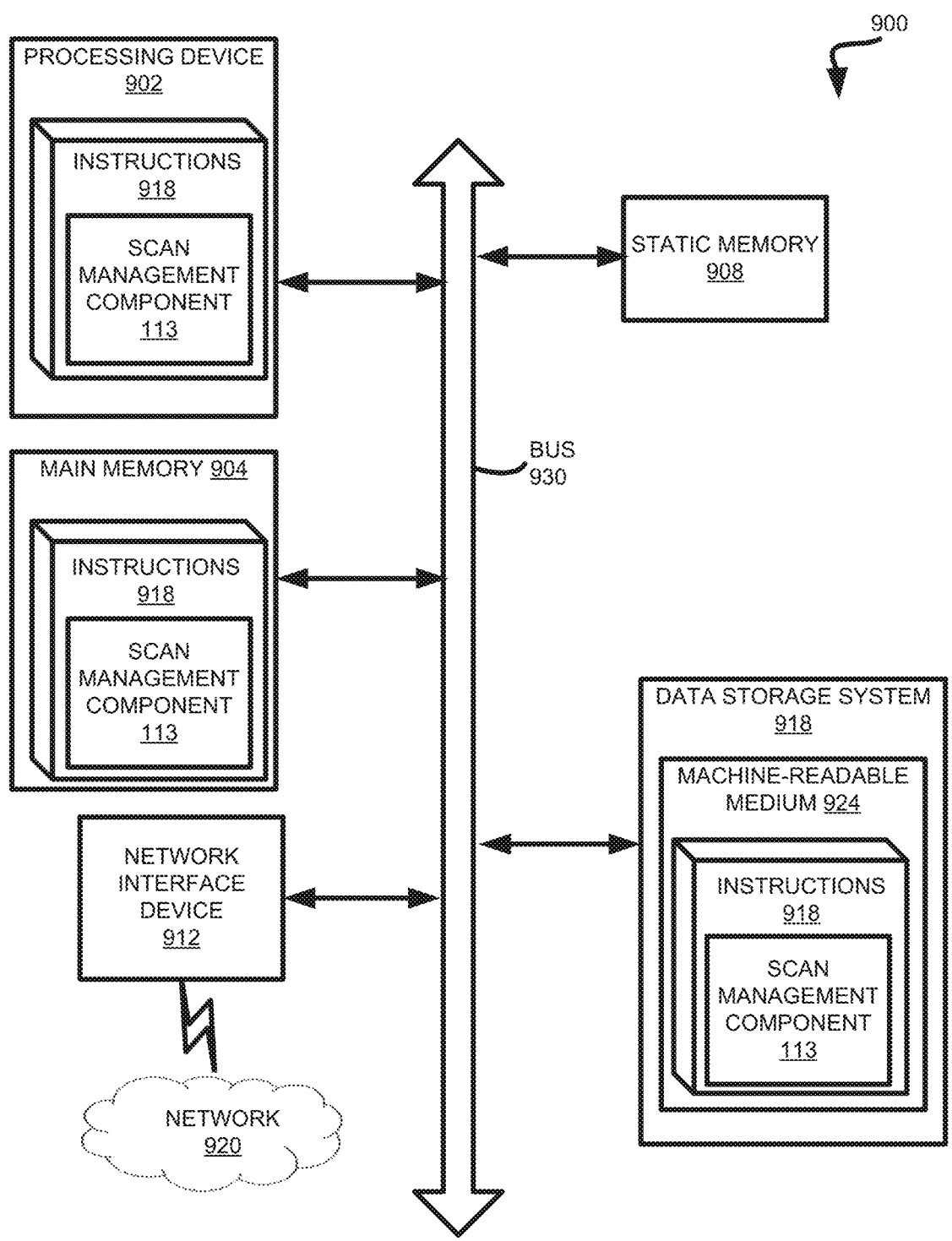
FIG. 5 is a block diagram of an example computer system in which embodiments of the disclosure can operate.

FIG. 5 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1 or 2) that includes, is coupled to, or utilizes a memory sub-system (e.g., the memory sub-system 110 of FIG. 1 or 2) or can be used to perform the operations of a controller (e.g., to execute an operating system to perform operations corresponding to the scan management component 113 of FIG. 1 or 2). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 810 (e.g., flash memory, static random access memory (SRAM), etc.), and a data storage system 918, which communicate with each other via a bus 930.

Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 928 for performing the operations and steps discussed herein. The computer system 900 can further include a network interface device 912 to communicate over the network 920.

The data storage system 918 can include a machine-readable storage medium 924 (also known as a computer-readable medium) on which is stored one or more sets of instructions 928 or software embodying any one or more of the methodologies or functions described herein. The instructions 928 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1 or 2.

In one embodiment, the instructions 928 include instructions to implement functionality corresponding to the scan management component 113 of FIG. 1 or 2. While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the disclosure is not described with reference to any particular programming language. It will be appreciated that a variety of programming languages can be used to implement the teachings of the disclosure as described herein.

The disclosure can be provided as a computer program product, or software, that can include a machine-readable medium having stored thereon instructions, which can be used to program a computer system (or other electronic devices) to perform a process according to the disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc. The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an embodiment" or "one embodiment" or "an implementation" or "one implementation" or the like throughout may or may not mean the same embodiment or implementation. One or more embodiments or implementations described herein may be combined in a particular embodiment or implementation. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory device; and
   a processing device, operatively coupled to the memory device, to perform operations comprising:
      identifying one or more mandatory scan wordlines of the memory device and one or more remaining wordlines of the memory device;
      performing a plurality of scan iterations with respect to a plurality of pages of the memory device, such that performing each scan iteration comprises:
         identifying, by applying a predefined functional transformation to identifiers of the remaining wordlines, one or more scheduled scan wordlines of the memory device,
         scanning a subset of pages of the memory device that are addressable by the mandatory scan wordlines and the scheduled scan wordlines;
      wherein a combination of a first plurality of pages addressable by the scheduled scan wordlines selected by the plurality of scan iterations and a second plurality of pages addressable by the mandatory scan wordlines comprises the plurality of pages of the memory device.

2. The system of claim 1, wherein scanning the subset of pages of the memory device further comprises:
evaluating, with respect to a certain page of the subset of pages, a data state metric;
responsive to determining that the data state metric fails to satisfy a quality criterion, performing a media management operation with respect to a block comprising the certain page.

3. The system of claim 2, wherein performing the media management operation comprises relocating, to another block, data stored by the block comprising the certain page.

4. The system of claim 2, wherein the data state metric reflects a bit error rate of the certain page.

5. The system of claim 1, wherein identifying the one or more mandatory scan wordlines further comprises:
reading system metadata associated with the memory device.

6. The system of claim 1, wherein identifying the one or more mandatory scan wordlines further comprises:
identifying, among a plurality of wordlines of the memory device, one or more wordlines that are triggering more error handling operations that the remaining wordlines of the memory device.

7. The system of claim 1, wherein identifying the one or more scheduled scan wordlines further comprises:
incrementing, by a predefined value, each of identifiers of the scheduled scan wordlines processed by a previous scan iteration.

8. The system of claim 1, wherein identifying the one or more scheduled scan wordlines further comprises:
randomly selecting a predefined number of wordlines among the remaining wordlines of the memory device.

9. A method, comprising:
identifying, by a processing device, one or more mandatory scan wordlines of the memory device and one or more remaining wordlines of a memory device;
performing a plurality of scan iterations with respect to a plurality of pages of the memory device, such that performing each scan iteration comprises:
identifying, by applying a predefined functional transformation to identifiers of the remaining wordlines, one or more scheduled scan wordlines of the memory device,
scanning a subset of pages of the memory device that are addressable by the mandatory scan wordlines and the scheduled scan wordlines;
wherein a combination of a first plurality of pages addressable by the scheduled scan wordlines selected by the plurality of scan iterations and a second plurality of pages addressable by the mandatory scan wordlines comprises the plurality of pages of the memory device.

10. The method of claim 9, wherein scanning the subset of pages of the memory device further comprises:
evaluating, with respect to a certain page of the subset of pages, a data state metric;
responsive to determining that the data state metric fails to satisfy a quality criterion, performing a media management operation with respect to a block comprising the certain page.

11. The method of claim 9, wherein identifying the one or more mandatory scan wordlines further comprises:
reading system metadata associated with the memory device.

12. The method of claim 9, wherein identifying the one or more mandatory scan wordlines further comprises:
identifying, among a plurality of wordlines of the memory device, one or more wordlines that are triggering more error handling operations that the remaining wordlines of the memory device.

13. The method of claim 9, wherein identifying the one or more scheduled scan wordlines further comprises:
incrementing, by a predefined value, each of identifiers of the scheduled scan wordlines processed by a previous scan iteration.

14. The method of claim 9, wherein identifying the one or more scheduled scan wordlines further comprises:
randomly selecting a predefined number of wordlines among the remaining wordlines of the memory device.

15. A non-transitory computer-readable storage medium comprising executable instructions that, when executed by a processing device, cause the processing device to perform operations comprising:
identifying one or more mandatory scan wordlines of a memory device and one or more remaining wordlines of the memory device;
performing a plurality of scan iterations with respect to a plurality of pages of the memory device, such that performing each scan iteration comprises:
identifying, by applying a predefined functional transformation to identifiers of the remaining wordlines, one or more scheduled scan wordlines of the memory device,
scanning a subset of pages of the memory device that are addressable by the mandatory scan wordlines and the scheduled scan wordlines;
wherein a combination of a first plurality of pages addressable by the scheduled scan wordlines selected by the plurality of scan iterations and a second plurality of pages addressable by the mandatory scan wordlines comprises the plurality of pages of the memory device.

16. The non-transitory computer-readable storage medium of claim 15, wherein scanning the subset of pages of the memory device further comprises:
evaluating, with respect to a certain page of the subset of pages, a data state metric;
responsive to determining that the data state metric fails to satisfy a quality criterion, performing a media management operation with respect to a block comprising the certain page.

17. The non-transitory computer-readable storage medium of claim 15, wherein identifying the one or more mandatory scan wordlines further comprises:
identifying, among a plurality of wordlines of the memory device, one or more wordlines that are triggering more error handling operations that the remaining wordlines of the memory device.

\* \* \* \* \*